United States Patent
Ide et al.

(10) Patent No.: US 6,342,166 B1
(45) Date of Patent: Jan. 29, 2002

(54) METHOD OF DETECTING END POINT OF POLISHING OF WAFER AND APPARATUS FOR DETECTING END POINT OF POLISHING

(75) Inventors: Satoru Ide; Kiyoshi Tanaka; Toshihiro Itho, all of Kanagawa (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/454,530

(22) Filed: Dec. 6, 1999

(30) Foreign Application Priority Data

Dec. 10, 1998 (JP) .............................. 10-368466

(51) Int. Cl.⁷ ....................... H01L 21/302; B44C 1/22
(52) U.S. Cl. ....................... 216/84; 216/85; 216/88; 216/22; 216/89; 438/8; 438/692; 438/7; 438/693
(58) Field of Search ............... 216/84, 85, 88, 216/89, 22; 438/8, 692, 7, 693

(56) References Cited

FOREIGN PATENT DOCUMENTS

| JP | 57-138575 | 8/1982 |
|----|-----------|--------|
| JP | 61-214970 | 9/1986 |
| JP | 4-255218 | 9/1992 |
| JP | 5-309559 | 11/1993 |
| JP | 7-328916 | 12/1995 |
| JP | 8-174411 | 7/1996 |
| JP | 9-7985 | 1/1997 |
| JP | 10-160420 | 6/1998 |

*Primary Examiner*—Jeffrie R. Lund
*Assistant Examiner*—Sylvia R. MacArthur
(74) *Attorney, Agent, or Firm*—Oblon, Spivak, McClelland, Maier & Neustadt, P.C.

(57) ABSTRACT

A method of detecting an end point of polishing of a wafer, comprising the steps of: using a color identifying sensor for recognizing a color component of light by applying light from a light source and by converging reflected light to an optical fiber to cause the color identifying sensor to previously recognize a color component of a substance of a wafer which must be polished; displaying an ON-state when the color component is recognized and an OFF-state when the color component is not recognized; one point (except for the central point) of the surface of the rotating wafer is irradiated with light emitted from the color identifying sensor to cause the color identifying sensor to detect the number of times (m) of off-states; and determining an end of polishing of the wafer when the detected number of times (m) coincides with the number (n) of off-states indicating an optimum end point of polishing of the wafer.

4 Claims, 11 Drawing Sheets

METHOD OF DETECTING END POINT OF POLISHING OF WAFER AND APPARATUS FOR DETECTING END POINT OF POLISHING

BACKGROUND OF THE INVENTION

1. Technical Field of the Invention

The present invention relates to a method of detecting an end point of chemical-mechanical polishing (CMP) of a wafer, and further to an apparatus for detecting an end point of polishing of a wafer with which the method is embodied, in which a permalloy magnetic layer or a metal layer for a device is formed on a surface of a substrate made of silicon, an alumina-titanium carbide alloy, LCD glass, an electric circuit made of Cu, Ag or Au is provided if necessary, and the wafer on which an insulating layer has been formed is chemimechanically polished.

2. Description of the Related Art

The CMP has been developed for providing smooth topographies on surfaces deposited on semiconductor substrates.

A method of CMP has been employed as follows. A wafer "w" is bonded to a plate of a holder with wax so as to be pressed against a platen to which a polishing cloth has been bonded. While supplying polishing-material slurry to the platen, the platen and the wafer are rotated to polish an insulating layer or metal layer by chemimechanically polishing the wafer until the permalloy layer or the metal layer for a device is exposed to the outside.

Another method has been employed as follows. A wafer is vacuum-adsorbed to a chuck table, and then a platen to which a polishing cloth has been bonded on the plate of a head is pressed from the upper surface of the wafer. While supplying polishing-material slurry to the upper surface of the wafer, the platen and the wafer are rotated to polish the insulating layer or metal layer by the chemimechanically polishing (CMP) the wafer until the permalloy layer or the metal layer for a device is exposed to the outside.

Figure 10:
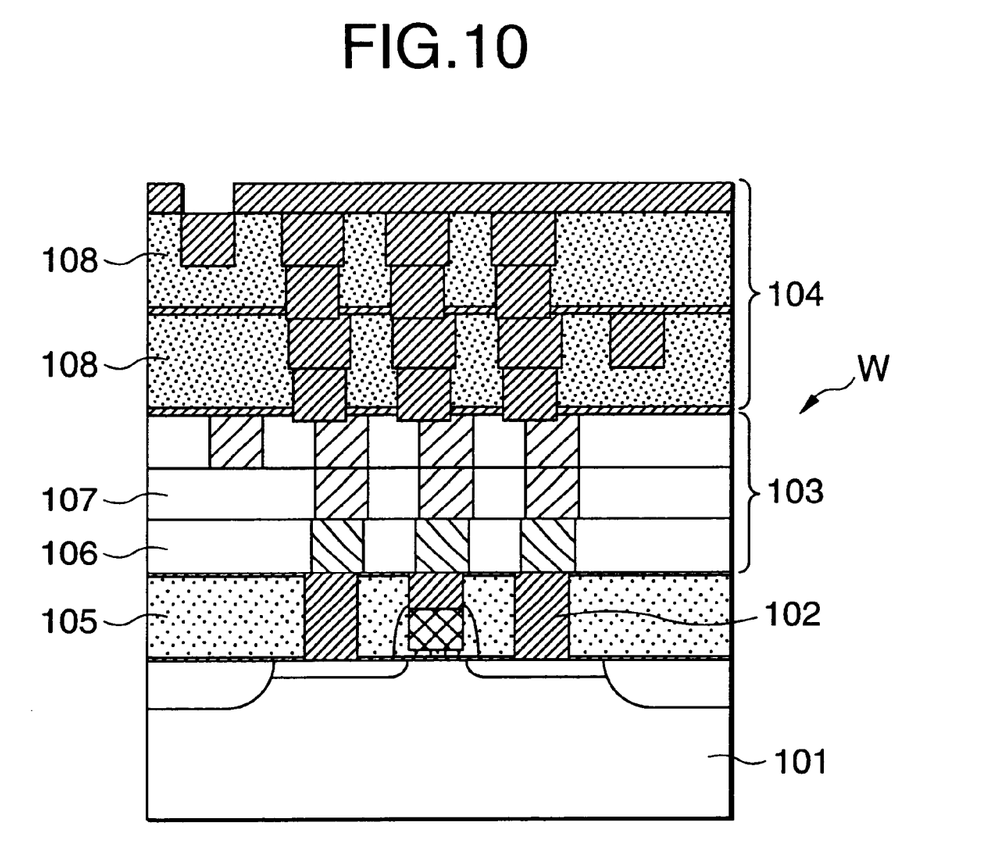
FIG. 10 is a cross sectional view showing a silicon wafer having a multilayer structure.
Figure 11A:
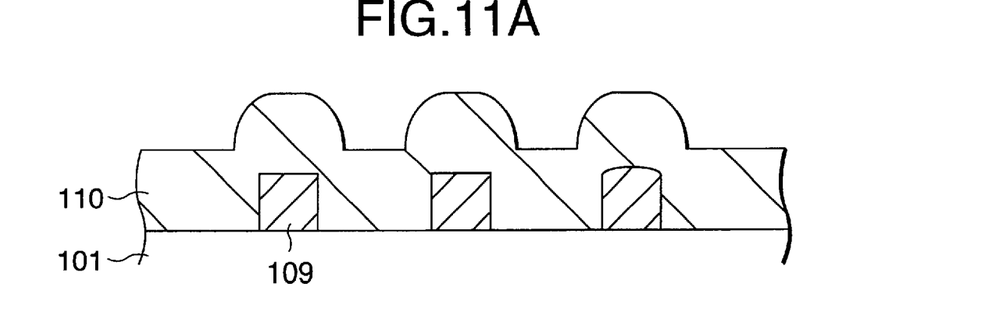
Figure 11B:
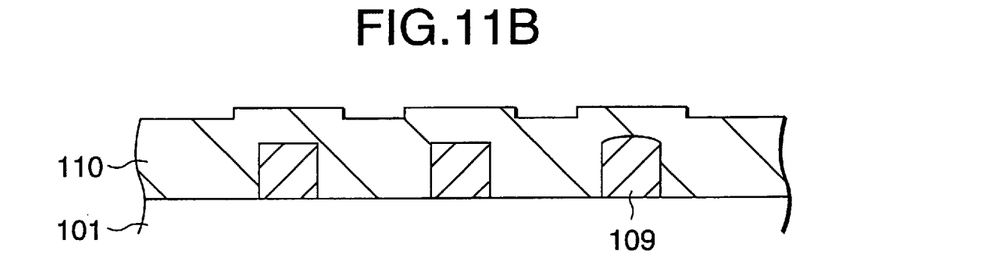
Figure 11C:
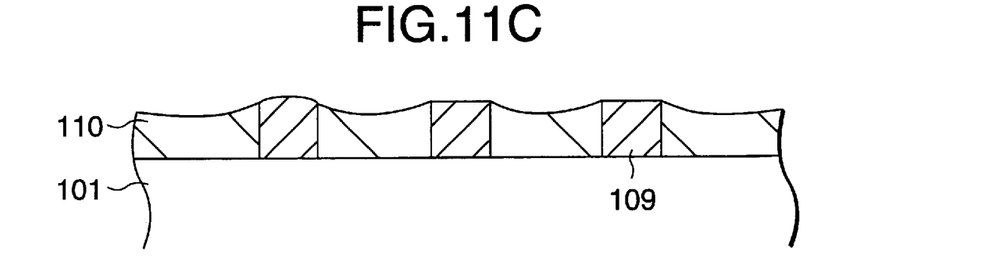
Figure 11D:
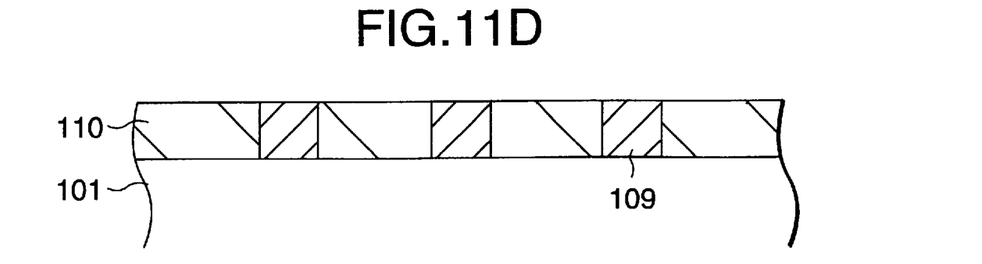

In the CMP process, the overall surface of the permalloy layer or the metal layer for a device is coated with copper, aluminum, silver or gold. Then, an excess portion of the metal is chemimechanically polished to obtain a device wafer having an electric circuit made of copper, aluminum, silver or gold. In another CMP process, the overall surface of the permalloy layer or the metal layer is coated with an insulating layer made of silicon oxide, aluminum oxide or titanium oxide. Then, an excess portion of the insulating layer is chemimechanically polished so that a flat wafer is obtained in which the insulating layer is mixed with the device. FIG. 10 shows a multilayer circuit structure formed on a silicon wafer "w" having a MOSFET (refer to Japanese Patent Laid-Open No. 10-303152 and GB2324750A). On a surface of a silicon oxide insulating layer 101a of a polished silicon substrate 101, the multilayer circuit includes: (1) a tungsten (W) contact plug portion 102 for connecting the MOSFET to an upper-layer circuit; (2) an aluminum local circuit portion 103 for establishing the electric connection in the CMOS circuit block; and (3) a copper global circuit portion 104 in which copper is embedded in an organic film having a low dielectric constant.

The device isolation among the MOSFET of the foregoing device wafer is performed by a CMP method to be a flattening device isolating structure in which the silicon oxide films are embedded in grooves formed in the silicon substrate 101. Then, a BPSG film 105 is grown on the MOSFET, and then the BPSG film is flattened by the CMP method. Then, a diffusion layer of the MOSFET and a contact hole which reaches the gate electrode are provided for the flattened BPSG film 105. Polishing-material slurry prepared by dispersing silica colloidal particles in oxidizer solution and the CMP method are used to form the W contact hole plug. A first embedded aluminum circuit in which aluminum is embedded in the first circuit groove formed in the first silicon oxide film 106 is formed on the W contact hole plug. Moreover, a second embedded aluminum circuit is formed by embedding aluminum in a first through hole and a second circuit groove, which are formed in the second silicon oxide film 107 formed above the first embedded aluminum circuit.

The foregoing embedded aluminum circuits are formed in such a manner that aluminum embedded films are formed in the circuit groove and the through holes by a high-temperature sputtering method, and the Al-CMP method with the polishing-material slurry are employed to flatten the surface.

Moreover, a second through hole is formed in an organic film 108 formed on the second siliconoxide film 107 and having a low dielectric constant; a third embedded copper circuit is formed by embedding copper in a third circuit groove; a third through hole is formed; and a fourth embedded copper circuit is formed by embedding copper in a fourth circuit groove. The foregoing embedded copper circuits are formed by embedding copper in the circuit grooves and/or through holes to form copper films by an MOCVD method. Then, the polishing-material slurry is used to perform a CMP polishing operation so as to flatten the surface.

To manufacture the device wafer having the MOSFET, the metal embedding and flattening process using W, Al, Cu, Ti, TiN, WSix, TiSix and the like is frequently employed in a metal CMP method. Also isolation and formation of the flattened device and flattening of the surface of the BPSG film are performed by the oxide-film CMP method.

As shown in FIGS. 11A to 11D, the magnetic head substrate is processed such that a wafer 1 (see FIG. 11A) having a substrate 101 on which a permalloy layer 109 is formed. Then, an aluminum insulating layer 110 is furthermore formed. The wafer 1 is polished by the CMP method until the permalloy layer is exposed to the outside (see FIG. 11D) by chemimechanically polishing the wafer 1. As a result, a plurality of the permalloy layers, for example, two to five permalloy layers are sometimes formed.

An automatic (unmanned) polishing means for polishing the wafer has been required from a market. Thus, a variety of CMP automatic polishing apparatuses for automatically detecting an end point of polishing have been suggested. The end point of polishing is detected by any one of the following methods.

(1) The thickness of the wafer which is being polished is measured by a thickness meter to determine the end point in accordance with an amount of polishing (refer to Japanese Patent Laid-Open No. 62-257742, Japanese Patent Laid-Open No. 9-193003, Japanese Patent Laid-Open No. 10-106984 and Japanese Patent Laid-Open No. 10-98016).

(2) A method for determine the end point in accordance with a load electric current, voltage or change in the resistance of the motor of the platen or the chucking mechanism which is performing the polishing operation (refer to Japanese Patent Laid-Open No. 61-188702, Japanese Patent Laid-Open No. 6-252112, Japanese Patent Laid-Open No. 8-99625, Japanese Patent Laid-Open No. 9-70753, Japanese Patent Laid-Open No. 10-44035, Japanese Patent Laid-Open No. 10-128658 and Japanese Patent Laid-Open No. 10-177976).

(3) A method of determining the end point of polishing in accordance with change in the torque of the motor of the platen or the chucking mechanism which is performing the polishing operation (refer to Japanese Patent Laid-Open No. 5-138529, Japanese Patent Laid-Open No. 6-216095, Japanese Patent Laid-Open No. 8-139060, Japanese Patent Laid-Open No. 8-197417, Japanese Patent Laid-Open No. 9-36073, Japanese Patent Laid-Open No. 9-262743 and Japanese Patent Laid-Open No. 10-256209).

(4) A method in which the wafer being polished is irradiated with a laser beam to determine the end point of polishing in accordance with the quantity of reflected light (refer to Japanese Patent Laid-Open No. 57-138575, Japanese Patent Laid-Open No. 61-214970, Japanese Patent Laid-Open No. 4-255218, Japanese Patent Laid-Open No. 5-309559, Japanese Patent Laid-Open No. 7-328916, Japanese Patent Laid-Open No. 8-174411, Japanese Patent Laid-Open No. 9-7985 and Japanese Patent Laid-Open No. 10-160420).

(5) A method in which phosphorus or tracer particles serving as an index is added to the polishing-material slurry to measure the quantity of the index on the polishing cloth so as to determine the end point of polishing (refer to Japanese Patent Laid-Open No. 2-241017 and Japanese Patent Laid-Open No. 8-69987).

A method in which a differential interference microscope is used to observe the surface of the wafer to determine the end point of polishing (refer to Japanese Patent Laid-Open No. 5-234971 and Japanese Patent Laid-Open No. 5-226203).

The method (1) in which the thickness of the wafer is measured is arranged such that the thickness of only a part of the wafer is measured. Since a long time is required to measure the distribution of thicknesses of the overall portion of the wafer, only a poor accuracy can be realized.

Each of the determining method (2) in which the electric current, the voltage or the resistance is used and the method (3) in which the torque is used, is not a method of directly observing the surface of the polished wafer. Also only a poor accuracy of flattening can be obtained.

The method (4) in which the quantity of reflected laser beam is used, is arranged such that the wafer is directly irradiated with the laser beam to determine the end point in accordance with the quantity of reflected light. Therefore, presence of water of the polishing-material slurry for use in the CMP polishing process on the surface of the wafer causes data to be scattered. Hence it follows that an apparatus for cleaning and drying the position on the surface of the wafer on which the laser beam is made incident and from which the same is reflected must be joined. Therefore, the foregoing method cannot be employed when the size of the CMP apparatus is reduced. What is worse, the cost of the apparatus cannot be reduced. Moreover, the polishing process is interrupted because the cleaning and drying processes of the wafer have to be performed.

The method (5) in which the index is added cannot be employed because influences on polishing of the wafer and on a post-process performed after the CMP polishing process has been completed are not known.

SUMMARY OF THE INVENTION

An object of the present invention is to provide a method of detecting an end point of polishing of a wafer and an apparatus for detecting an end point using the foregoing method, which are free from deflection of detected data concerning the physical properties of the surface of the wafer, even if water is present on the surface of a wafer or if the process for flattening the surface of the polished wafer is being performed and, therefore, the distance from the detecting apparatus to the wafer has a slight deviation.

According to a first aspect of the present invention, there is provided a method of detecting an end point of polishing of a wafer, comprising the steps of: using a color identifying sensor for recognizing a color component of light by applying light from a light source and by converging reflected light to an optical fiber to cause the color identifying sensor to previously recognize a color component of a substance of a wafer which must be polished; displaying an ON-state when the color component is recognized and an OFF-state when the color component is not recognized; one point (except for the central point) of the surface of the rotating wafer is irradiated with light emitted from the color identifying sensor to cause the color identifying sensor to detect the number of times (m) of off-states at predetermined intervals of time during an operation for polishing the wafer; and determining an end of polishing of the wafer when the detected number of times (m) coincides with the number (n) of off-states indicating an optimum end point of polishing of the wafer in a predetermined time which has previously been recorded.

According to a second aspect of the present invention, there is provided a method of detecting an end point of polishing of a wafer, comprising the steps of: using a color identifying sensor for recognizing a color component of light by applying light from a light source and by converging reflected light to an optical fiber to cause the color identifying sensor to previously recognize a color component of a substance of a wafer which must be polished; displaying an ON-state when the color component is recognized and an OFF-state when the color component is not recognized; one point (except for the central point) of the surface of the rotating wafer is irradiated with light emitted from the color identifying sensor to digital-display, on an axis of abscissa, on- and off-time at predetermined time during an operation for polishing the wafer; causing an integrated value ($\Sigma m$) of digital-displayed off-pulse widths in a predetermined time to be detected; and determining an end of polishing of the wafer when the detected integrated value ($\Sigma m$) coincides with an integrated value ($\Sigma n$) of off-pulse widths indicating a previously recorded optimum end point of polishing of the wafer in a predetermined time.

According to a third aspect of the present invention, there is provided a method of detecting an end point of polishing of a wafer, comprising the steps of: using a color identifying sensor for recognizing a color component of light by applying light from a light source and by converging reflected light to an optical fiber to cause the color identifying sensor to previously recognize a color component of a substance of a wafer which must be polished; displaying an ON-state when the color component is recognized and an OFF-state when the color component is not recognized; one point (except for the central point) of the surface of the rotating wafer is irradiated with light emitted from the color identifying sensor to cause the color identifying sensor to detect the number of times (m) of off-states at predetermined intervals of time during an operation for polishing the wafer; and determining an end of polishing of the wafer when the detected number of times (m) coincides with the number (n) of off-states indicating an optimum end point of polishing of the wafer in a predetermined time which has previously been recorded and when a detected integrated value ($\Sigma m$) coincides with an integrated value ($\Sigma n$) of off-pulse widths indicating a previously recorded optimum end point of polishing of the wafer in a predetermined time after performing the steps of digital-displaying, on an axis of abscissa, on- and off-time at predetermined time during an operation for polishing the wafer and causing an integrated value ($\Sigma$m) of digital-displayed off-pulse widths in a predetermined time to be detected.

According to a fourth aspect of the present invention, there is provided a method of detecting an end point of polishing of a wafer, wherein the wafer, which must be polished, is a wafer having a device provided for the surface of a silicon substrate thereof, and the overall surface of the wafer is coated with copper.

According to a fifth aspect of the present invention, there is provided a method of detecting an end point of polishing of a wafer according, wherein the predetermined time is time required to rotate the wafer one time.

According to a sixth aspect of the present invention, there is provided an apparatus for detecting an end point of polishing of a wafer arranged to be provided for an apparatus for chemimechanically polishing a wafer, the apparatus for detecting an end point of polishing of a wafer, comprising:

(a) a color identifying sensor arranged to recognize a color component of light by applying light from a light source, converge reflected light to an optical fiber and previously recognize a color component of a substance of a wafer which must be polished and capable of displaying an ON-state when the color component is recognized and an OFF-state when the color component is not recognized;

(b) a counter mechanism for irradiating one point (except for the central point) of the surface of the rotating wafer with light emitted from the color identifying sensor to detect the number of times (m) of off-states at predetermined intervals of time during an operation for polishing the wafer;

(c) a storage mechanism for storing the number of detection times;

(d) a calculating mechanism for making a comparison between the number of times (m) of off-states communicated from the counter mechanism as a signal and the number (n) of off-states previously recorded in the storage mechanism and indicating an optimum end point of polishing of the wafer in a predetermined time; and (e) a control mechanism for transmitting, to a chemimechanical polishing apparatus, a signal indicating a fact that a moment of time at which m=n is an end point of polishing of the wafer.

According to a seventh aspect of the present invention, there is provided an apparatus for detecting an end point of polishing of a wafer arranged to be provided for an apparatus for chemimechanically polishing a wafer, the apparatus for detecting an end point of polishing of a wafer, comprising:

(a) a color identifying sensor arranged to recognize a color component of light by applying light from a light source, converge reflected light to an optical fiber and previously recognize a color component of a substance of a wafer which must be polished and capable of displaying an ON-state when the color component is recognized and an OFF-state when the color component is not recognized;

(b) a counter mechanism for irradiating one point (except for the central point) of the surface of the rotating wafer with light emitted from the color identifying sensor to digital-display, on an axis of abscissa, on- and off-time at predetermined time during an operation for polishing the wafer so as to detect an integrated value ($\Sigma$m) of digital-displayed off-pulse widths in a predetermined time;

(c) a mechanism for storing the detected integrated value;

(d) a calculating mechanism for making a comparison between the detected integrated value ($\Sigma$m) and an integrated value ($\Sigma$n) of off-pulse widths indicating a previously recorded optimum end point of polishing of the wafer in a predetermined time; and (e) a control mechanism for transmitting, to a chemimechanical polishing apparatus, a signal indicating a fact that a moment of time at which $\Sigma$m=$\Sigma$n is an end point of polishing of the wafer.

According to an eighth aspect of the present invention, there is provided a CMP apparatus for chemimechanically polishing a wafer including a plurality of layers having an insulating layer and a metal layer on the insulating layer, the CMP apparatus comprising:

a chuck plate for holding the wafer;

a platen facing to the chuck plate; and a color identifying sensor having a light source emitting light to a polished surface of the wafer and an optical fiber converging the light reflected on the polished surface of the wafer, the color identifying sensor for recognizing a color component of the light.

According to a ninth aspect of the present invention, there is provided the CMP apparatus according to the eighth aspect of the present invention, wherein the color identifying sensor previously recognizes a color component of a substance of the wafer.

According to a tenth aspect of the present invention, there is provided the CMP apparatus according to the ninth aspect of the present invention, wherein the color identifying sensor displays an ON-state when the color component is recognized and an OFF-state when the color component is not recognized.

According to an eleventh aspect of the present invention, there is provided the CMP apparatus according to the eighth aspect of the present invention, wherein the color identifying sensor having a detecting unit for emitting the light generated from the light source through the optical fiber, converging the light reflected on the wafer.

According to the twelfth aspect of the present invention, there is provided the CMP apparatus according to the eight aspect of the present invention, wherein the detecting unit of the color identifying sensor faces to the wafer disposed on the chuck plate.

In the present invention, a color identifying sensor is used which is capable of obtaining data about a detected color component of light of metal in the surface of the metal of the surface of the wafer or the insulating film which is free from deviation even if water is present on the surface of a wafer or if the process for flattening the surface of the polished wafer is being performed. Therefore, detection of an end point of polishing of the wafer can accurately be performed.

BRIEF DESCRIPTION OF THE DRAWINGS

Each of FIGS. 11A to 11D is a diagram showing change in a state of polishing of a disc which occurs when an insulating film of a magnetic head is polished.

Each of FIGS. 12A to 12C is a diagram showing change in a state of polishing of a semiconductive wafer covered with copper thin layer.

DETAILED DESCRIPTION OF THE PRESENT INVENTION

The present invention will now be described in detail with reference to the accompanying drawings.

Wafer to Be Processed

A wafer to be processed of the present invention has a substrate made of silicon, an alumina-titanium carbide alloy or LCD glass. A permalloy magnetic layer made of, for example, Ni—Fe, Mn—Fe, Co—Fe, Ni—Rh—Fe, Co—Zr—Fe or Co—Fe—B is formed on the surface of the foregoing substrate. If necessary, a circuit made of Cu, Ag or Au is formed thereon. Then, an insulating layer made of aluminum oxide or the like is formed so that the wafer is formed. Alternatively, a wafer is subjected to a CMP process in each process for obtaining the foregoing wafer having the substrate on which the multilayer circuit layer is formed.

CMP Polishing Apparatus

Figure 1:
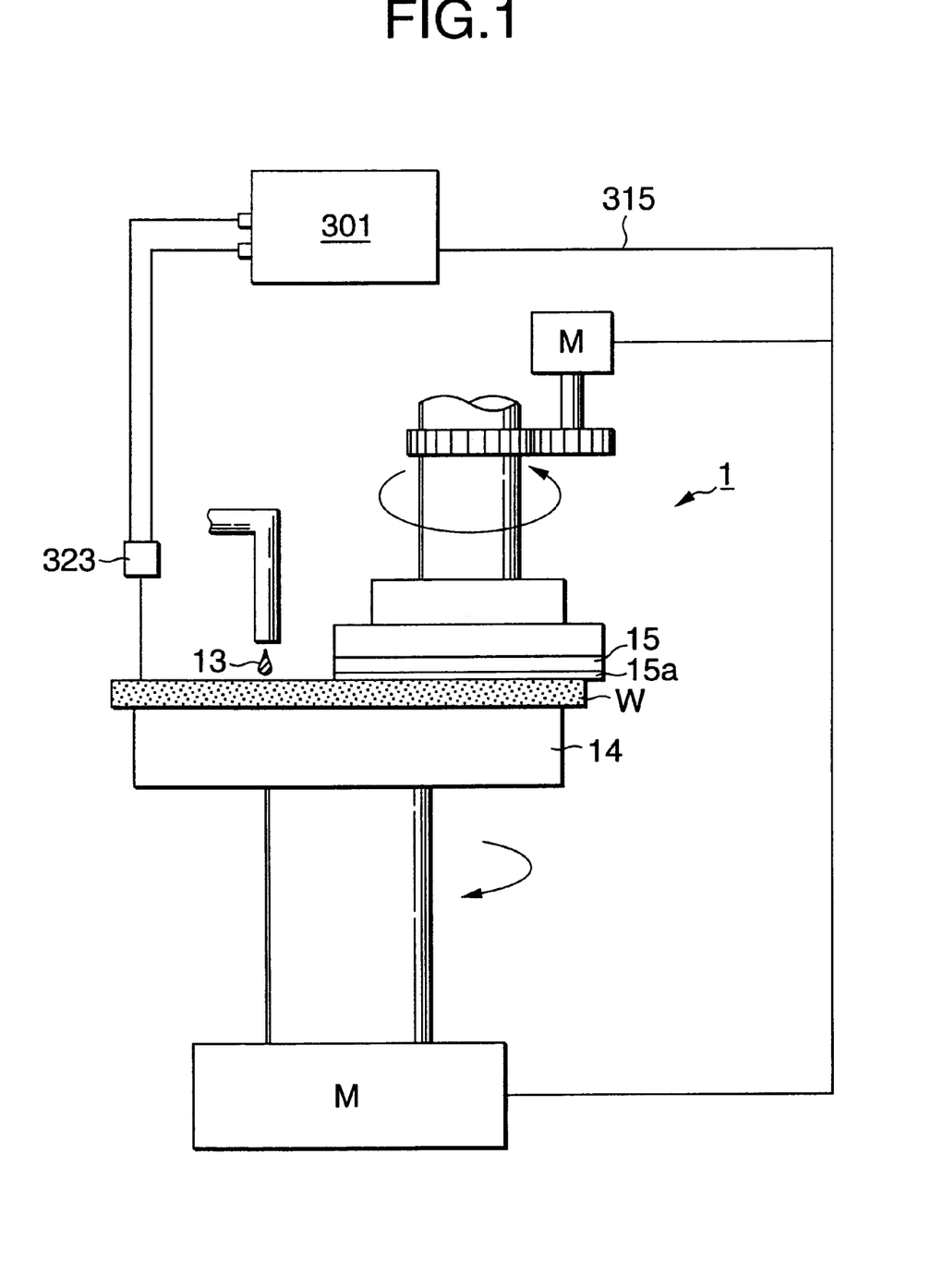
FIG. 1 is a plan view showing an example of a CMP polishing apparatus incorporating a color identifying sensor.

FIG. 1 shows a CMP polishing apparatus 1 of the present invention. In the CMP polishing apparatus 1, a wafer "w" is vacuum-adsorbed to a chuck table (plate) 14. Then, a platen 15 to which a polishing cloth 15a is bonded is pressed against, the upper surface of the wafer. While supplying polishing-material slurry 13 to the upper surface of the wafer, the platen and the wafer are rotated to polish the wafer. In stead of the platen, a polishing tape may be used as a substitute for the platen.

Figure 2:
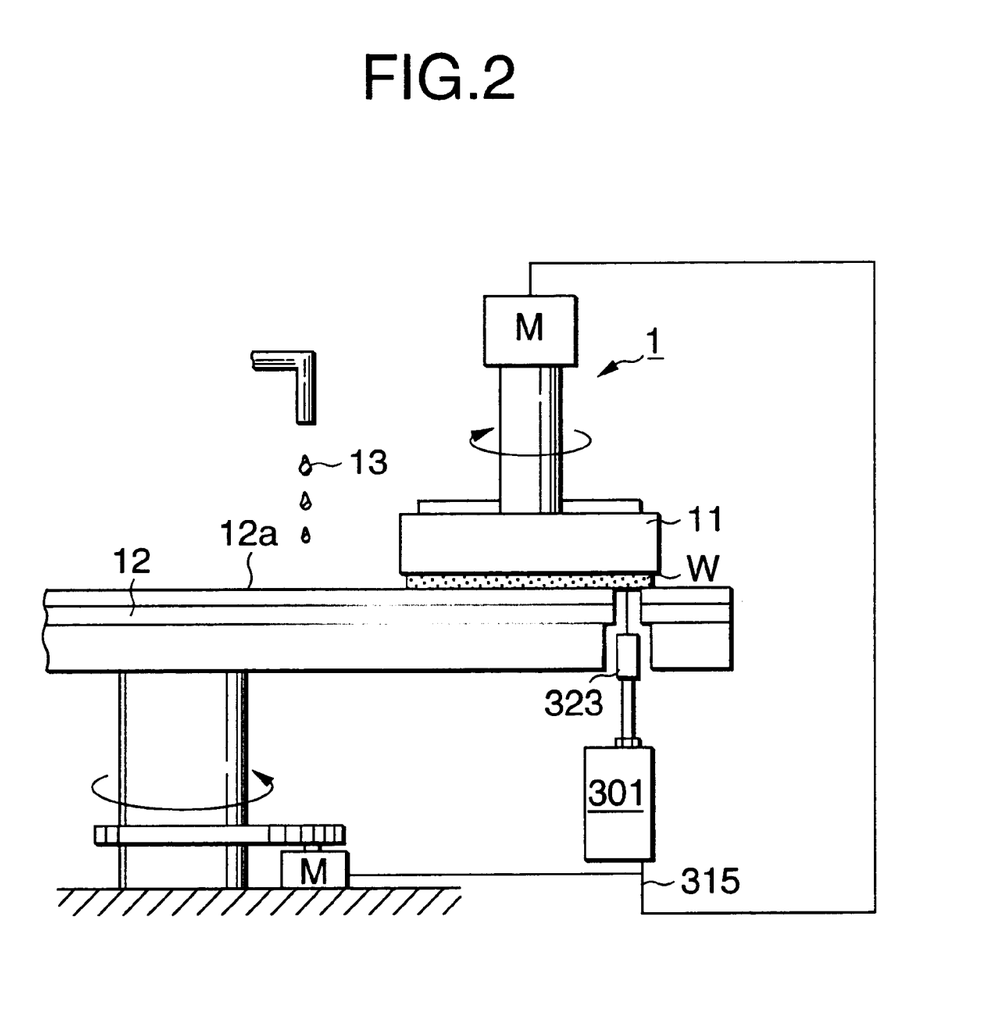
FIG. 2 is a plan view showing another example of the CMP polishing apparatus incorporating the color identifying sensor.

Alternatively, FIG. 2 show another CMP apparatus 1 arranged such that a wafer "w" is bond to a head or vacuumed onto the chuck plate 11. Then, the wafer w is pressed against a platen 12 to which a polishing cloth 12a is bonded. While supplying polishing-material slurry 13 to the platen 15, the platen and the semiconductor wafer are rotated so that the chemimechanical polishing (CMP) apparatus polishes the wafer.

Polishing-Material Slurry

The components of the polishing-material slurry for use to perform the CMP polishing operation vary according to the composition, the structure and an amount of polishing of the wafer to be polished.

For example, when a permalloy layer is polished, aqueous polishing-material slurry may be employed which contains (a) abrasive grains having an average particle size of 0.05 mm to 1 mm in a quantity of 0.1 wt % to 10 wt %, (b) an inorganic salt selected from water-soluble inorganic aluminum salts and nickel salts in a quantity of 0.1 wt % to 3 wt %; and (c) an aqueous chelating agent.

Aluminum oxide, cerium oxide, single-crystal diamond, polycrystal diamond, siliconoxide, silicon carbide, chromium oxide or glass powder may be used as the abrasive grains. The average particle size of the abrasive grain to be used is 0.1 μm to 1.0 μm, preferably 0.3 μm to 0.5 μm. The quantity of the abrasive grains having the component (a) with respect to the polishing-material slurry varies according to the type of the abrasive grains and purpose of the same. The quantity is 0.05 wt % to 10 wt %, preferably 0.1 wt % to 3 wt %. If the quantity is smaller than 0.05 wt %, a practical polishing velocity cannot be realized. If the quantity is larger than 10 wt %, the effect cannot furthermore be improved. What is worse, use of the abrasive grains in a large quantity causes an economic disadvantage.

The component (b) which is the water-soluble inorganic salt or the nickel salt being an inorganic slat improves the polishing velocity. The component (b) is exemplified by acetate of aluminum or nickel, hydrochloride, sulfate, phosphate and thiosulphate. Specifically, the foregoing component is any one of the following materials: aluminum nitrate, nickel nitrate, aluminum sulfate and the like. The water-soluble inorganic salt is contained in the polishing-material slurry in a quantity of 0.1 wt % to 3 wt %.

The water-soluble chelating agent which is the component (c) is added to the slurry in order to raise the polishing velocity and flatten the obtained wafer. The water-soluble chelating agent is exemplified by ethylene diamine tetraacetic acid (EDTA), ethylene diamine tetraacetate disodium (EDTA-2), alkali metal salt of aminosulfonic acid-N, N-diacetate, alkali metal salt of 2, 2-dimethylpropane bisoxide, diethylene triamine pentaacetate and its sodium salt. The chelating agent which is the component (c) is contained in the polishing-material slurry in a quantity of 0.1 wt % to 3 wt %.

To the polishing-material slurry, aqueous medium, polishing oil, a rust-preventive agent, a dispersing agent, an antiseptic agent, an antifoaming agent and a pH adjuster and the like are added.

The dispersing medium may be composed of only water or a mixture, the main component of which is water (in a quantity of 70 wt % to 99 wt % of the dispersing medium) and a sub-component of which is water-soluble organic solvent, such as alcohol or glycol (in a quantity of 1 wt % to 30 wt %. It is preferable that water is obtained by filtration using a 0.1 mm cartridge filter to satisfactorily remove giant particles. Alcohol may be methyl alcohol, ethyl alcohol or isopropyl alcohol. The glycol may be ethylene glycol, tetramethylene glycol, diethylene glycol, propylene glycol or polyethylene glycol.

The quantity of the water-soluble dispersing medium which is contained in the polishing-material slurry is 70 wt % to 99 wt %, preferably 90 wt % to 99 wt %. If the quantity is smaller than 70 wt %, the viscosity of slurry is raised excessively to smoothly supply the polishing-material slurry to the surface of the substrate and stably preserve slurry.

Polishing oil having a function of a polishing improver and an agent for dispersing abrasive grains is exemplified by a variety of surface active agents, ethylene glycol, propylene glycol, polyethylene glycol, polyoxyethylene alkylether, polyoxyethylene alkylphenylether, and pulonic-type non-ion surface active agent (addition reactant of ethylene oxide and propylene oxide).

The surface active agent may be an anion surface active agent, a cation surface active agent, a nonion surface active agent, an ampholytic surface active agent, use of both of the anion surface active agent and the nonion surface active agent, use of both of the anion surface active agent and the ampholytic surface active agent, use of both of the cation surface active agent and the nonion surface active agent or use of both of the cation surface active agent and the ampholytic surface active agent. The type of the surface active agent greatly contributes to the dispersing characteristic of the abrasive grains and the polishing velocity.

The quantity of the nonion surface active agent or the ampholytic surface active agent contained in the polishing-material slurry is 0.1 wt % to 10 wt %, preferably 0.1 wt % to 5 wt %. If the quantity is smaller than 0.1 wt %, the preservation stability of the polishing-material slurry cannot be improved. If the quantity is larger than 10 wt %, the dispersing characteristic cannot furthermore be improved.

When a metal work having, for example, a coppered layer is polished, slurry is employed which is prepared by dispersing silica gel and an oxidizer in ion exchange water. The oxidizer may be hydrogen peroxide, iron nitrate, copper sulfate or cerium nitrate ammonia. If necessary, acid, such as sulfuric acid, hydrochloric acid or acetic acid is added (refer to Japanese Patent Laid-Open No. 8-197414, Japanese Patent Laid-Open No. 9-208934, Japanese Patent Laid-Open No. 10-67986, Japanese Patent Laid-Open No. 10-226784, Japanese Patent Laid-Open No. 8-510437 and WO98/29515).

When the insulating layer is polished, slurry is employed which is prepared by dispersing abrasive grains, made of alumina, fumed silica or cerium oxide, and a base, such as potassium hydroxide, ammonia hydroxide or tetramethyl ammonium hydroxide in ion exchange water (refer to Japanese Patent Laid-Open No. 8-153696, Japanese Patent Laid-Open No. 9-82667, U.S. Pat. No. 5,820,448 and WO98/29515).

Color Identifying Sensor

The color identifying sensor emits light from a light source to converge reflected light to an optical fiber so as to detect a color component of light. The color identifying sensor is a digital color sensor for displaying a degree of coincidence of detected color with a registered color (a reference color) using scales 0 to 999. Thus, the color component of a substance to be polished (metal or the insulating layer), which is disposed on the wafer and which is to be traced, is recognized by a color sensor. When the foregoing color component is recognized, an LED (red) is turned on to indicate an ON-state. When the color component is not recognized, an LED (green) is turned on to indicate an OFF-state. When unevenness of color or contamination is attempted to be permitted after the sensitivity has been set by using a SET button, the permissible range of the sensitivity can precisely be adjusted while reading the digital value. A digital color identifying sensor of the foregoing type has been marketted by Keyence which are CZ-41 and CZ-40 (refer to Japanese Patent Laid-Open No. 6-241904). As an amplifier 301 for the color identifying sensor, CZ-V1 has been marketted. When an A/D converter FS01 (trade name) for forming 12-bit data of the quantity of received light is included by the apparatus, also the quantity of light can be digital-displayed as well as the sensitivity of the color component. The foregoing sensor has a response time of 300 $\mu$s/ms. The output can be switched between a mode in which the output is ON when the color is the same as the recorded color (the registered color) and output is OFF when the color is different from the registered color and a mode in which the output is OFF when the color is the same as the registered color and the output is ON when the color is different from the registered color.

Figure 3:
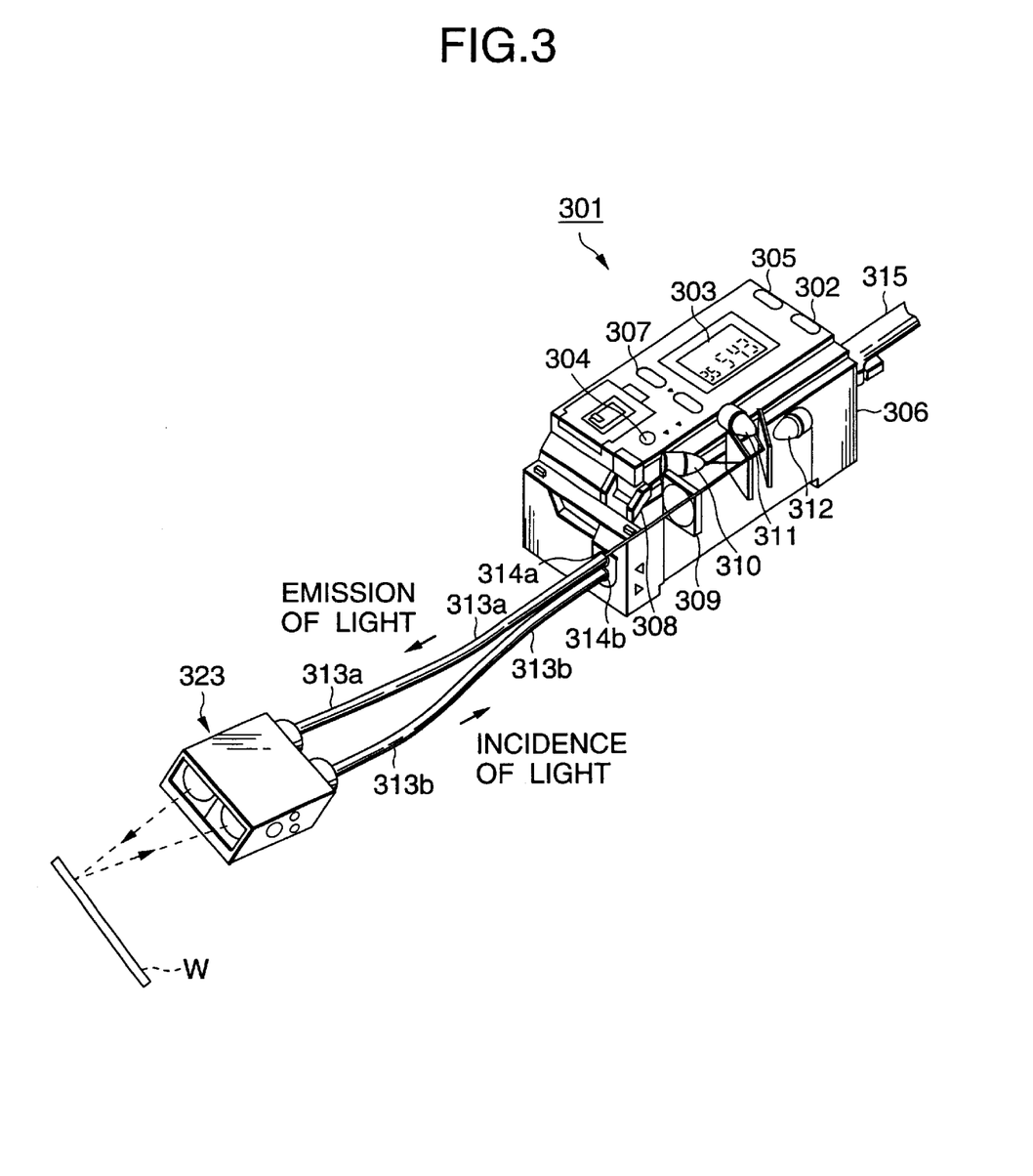
FIG. 3 is a perspective view showing the color identifying sensor.

FIG. 3 shows an example of a color identifying sensor 300 including an amplifier 301 and an optical fiber unit 313.

The amplifier 301 has a set button 302, an LED digital numeral display monitor 303, an output display lamp 304, a mode changing switch 305, an output changing switch 306, a set-value adjustment key 307, an optical fiber 308, a lens 309, a green LED 310, a blue LED 311, a red LED 312, connectors 314a and 314b to which optical fibers 313a and 313b are connected, and a cable 315 to which external units, such as a sequencer, are connected.

Figure 4:
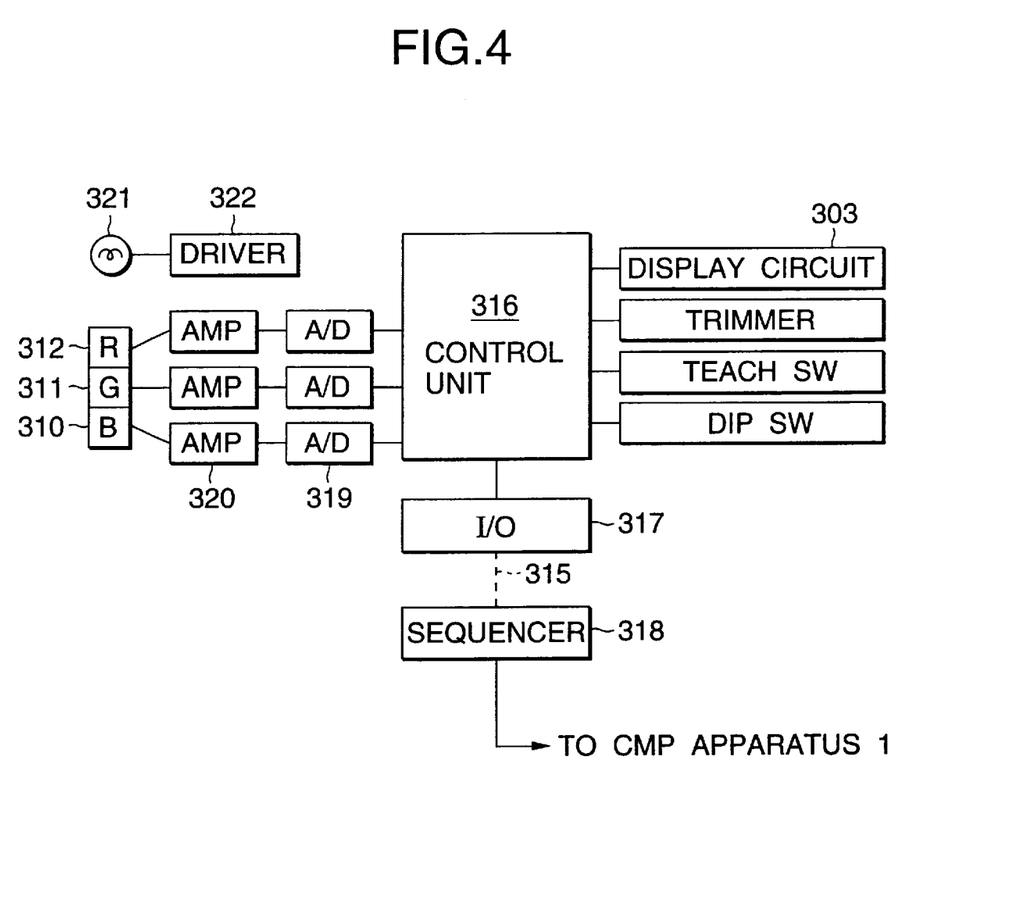
FIG. 4 is a plan view showing a control unit of an amplifier of the color identifying sensor.
Figure 5:
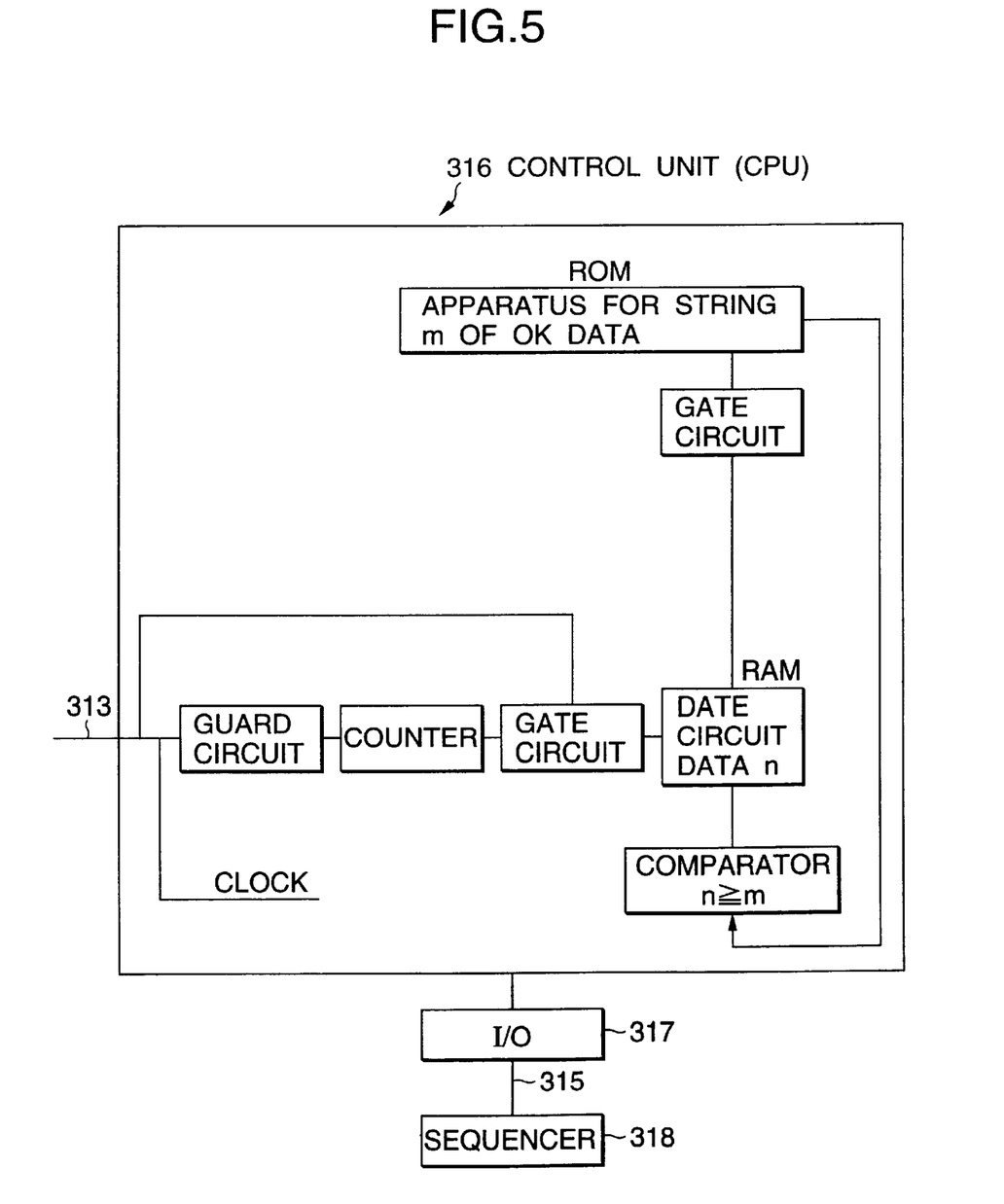
FIG. 5 is a plan view showing the control unit of the amplifier.

The body of the amplifier has a control unit 316 structured as shown in FIGS. 4 and 5. The control unit being a CPU comprises a microcomputer having a ROM in an OK-data (m) storage portion and a RAM in a data rewriting latch circuit portion. The cable 315 is connected to the amplifier through an I/O port 317. The external unit 318, such as the sequencer, is connected to the cable. The red LED 312, the green LED 311 and the blue LED 310 are connected to the control unit 316 through the A/D converter 319 and the amplifier (AMP) 320. The foregoing elements are disposed in a line in such a manner that the optical axes run in line with one another as shown in FIG. 3. The foregoing elements are connected to the connector 314a. The three types of LEDs are disposed in an extended portion from the connector 314a so as to be turned on by a driver 322. As shown in FIG. 4, a halogen lamp 321 may be employed as a substitute for the three types of the LED.

Figure 6:
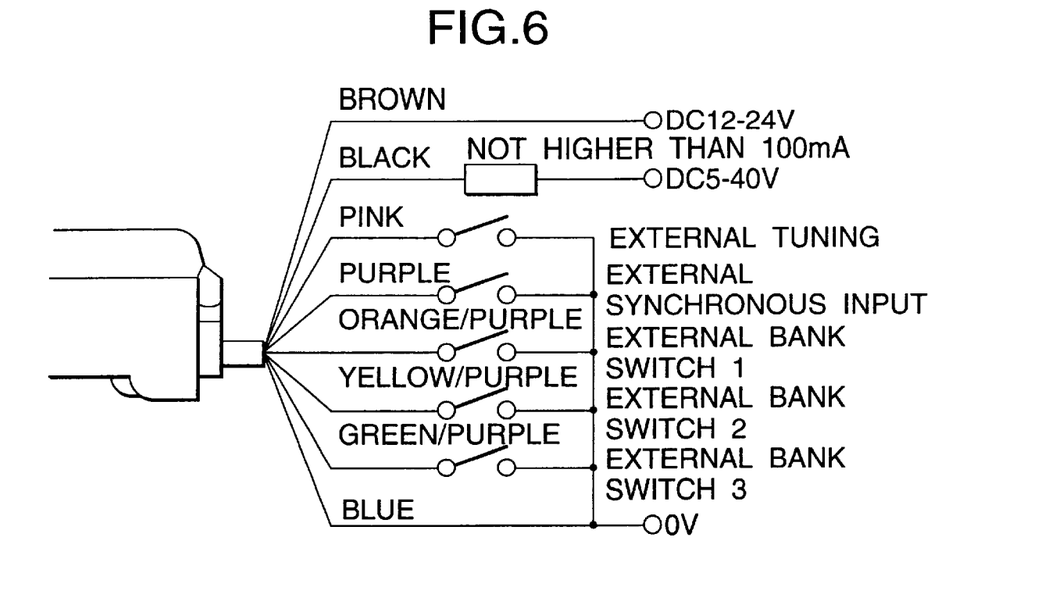
FIG. 6 is a circuit diagram showing an input/output circuit of the color identifying sensor.
Figure 7:
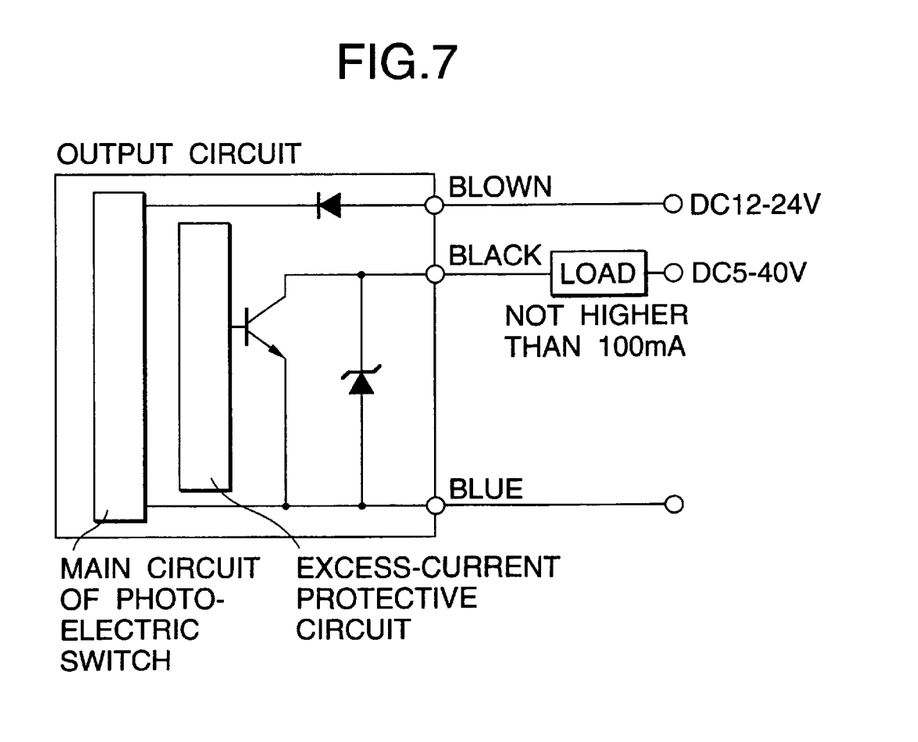
FIG. 7 is a diagram showing an output circuit of the color identifying sensor.
Figure 8:
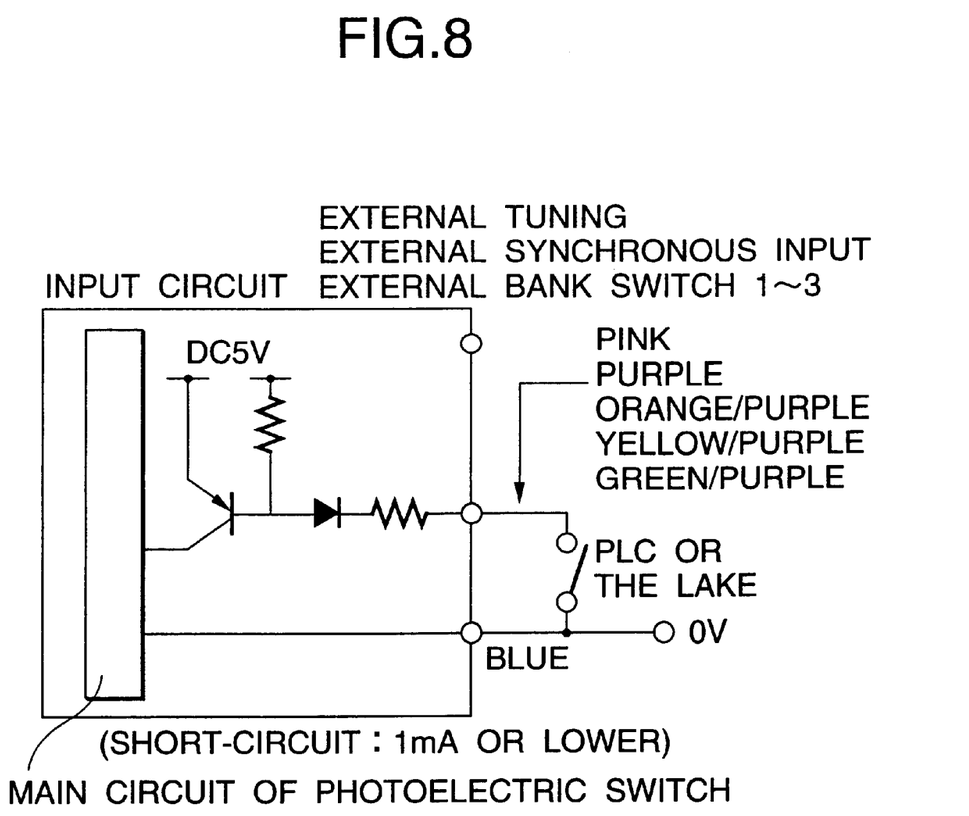
FIG. 8 is a diagram showing an input circuit of the color identifying sensor.

The optical fiber unit 313 which is connected to the amplifier 301 has a detecting terminal 323 for irradiating a subject (a wafer) "w" to be detected with light so as to extract reflected light. The detecting terminal 323 is connected to the optical fibers 313a and 313b. The optical fiber 313a in the form of a single core is used to emit light. Light is emitted from the three types of the LEDs of the light source disposed in the connector 314a so that light made to have one optical axis is transmitted. The optical fiber 313b having a plurality of cores is used to receive light. FIG. 6 shows a circuit diagram showing an input/output circuit, FIG. 7 shows the output circuit and FIG. 8 shows the input circuit.

Measurement of End Point of Wafer

As shown in FIGS. 1 and 2, the surface of the wafer "w" is irradiated with light emitted from the color identifying sensor 300 through the detecting terminal 323 secured to a predetermined position on the upper surface or the lower surface of the CMP polishing apparatus 1. Thus, light reflected from the wafer is made incident on the sensors 310, 311, 312 and 313b through the detecting terminal 323 so that the color is digital-displayed with any one of numerals 0 to 999.

Figure 12A:
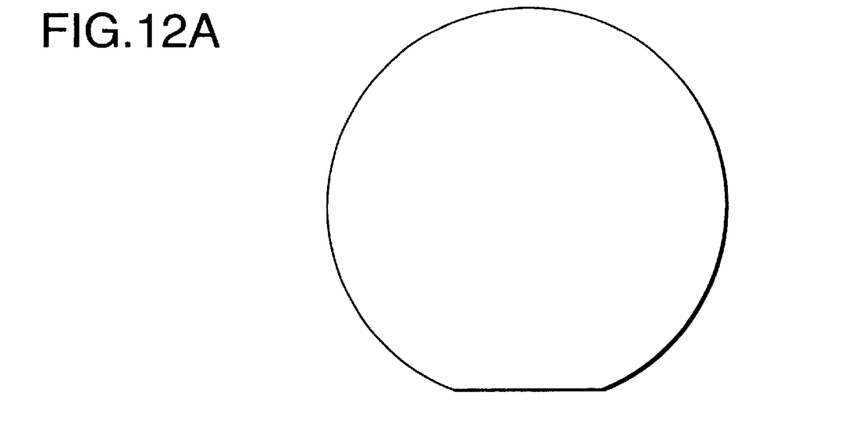
Figure 12B:
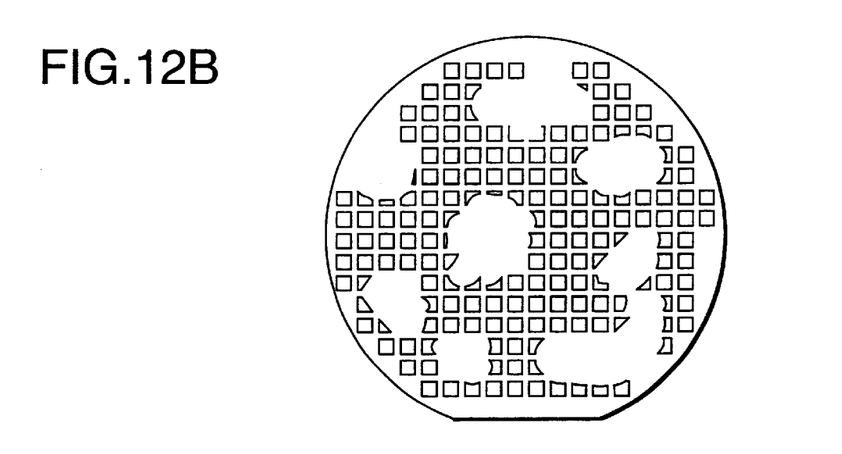
Figure 12C:
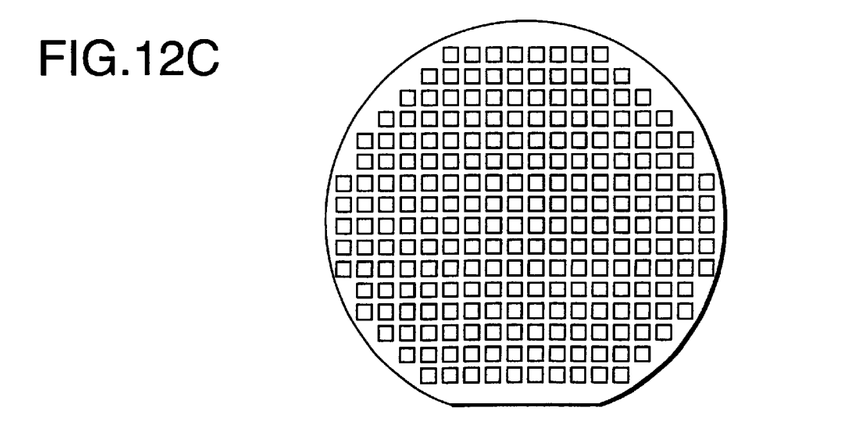

The method of detecting the end point of polishing of the wafer according to the present invention has the following steps. To facilitate the description, an operation for CMP-polishing a coppered wafer will now be described (See FIGS. 12A to 12C). First, the color identifying sensor 300 is caused to manually record the color component of a predetermined substance (copper, Ti or the like) on the surface of the wafer to be identified (for example, as a digital numeral of 999).

Second, the wafer is manually and chemimechanically polished. When the position realized after an optimum polishing operation has been performed is the end point of polishing, the number of OFF-state times (m) of the number of times of ON (999)/OFF (0 to 998) states in a time (for example, one second) required for the wafer to rotate one time is read by a counter so as to be stored (input to) in the OK-data circuit (the ROM). As an alternative to this, ON (999) /OFF (0 to 998) of the sensor in a time (for example, one second) in which the wafer is rotated one time is digital-displayed. Then, an integrated value (Σm) of the number (m) of OFF-states among the foregoing number of times and a value obtained by multiplying the OFF-pulse width by the OFF-time (μs) is read by a counter so as to be input (stored) in the ROM.

Third, the mode of the polishing apparatus 1 is changed to the automatic CMP mode so that the number (n) of OFF-states at predetermined intervals of time (in this embodiment, one second which is required for the wafer to rotate one time) or an integrated value (Σm) obtained by multiplying the OFF-pulse width by the OFF-time (μs) is read by the counter so as to be communicated to the latch circuit (RAM). Then, a comparison is made between data value m input to the foregoing ROM or (Σm) and data nor the value of Σn sequentially transmitted to the RAM. A moment of time at which the values have coincide with each other is considered as the end point of polishing of the wafer so that the completion of the rotation of the wafer and completion of the rotation of the polishing disc are communicated from the sequencer 318 to the CMP polishing apparatus. Thus, the polishing operation is completed.

The difference between the foregoing digital value of the reference color 999 of copper and the digital value of the copper layer of the polishing-material slurry film is too small. To make the value coincide with the actual digital value of the copper layer of the polishing-material slurry film, it is preferable that a value obtained by manually and actually performing the CMP polishing operation is employed.

When the digital value of the registered reference value of the substance which is polished and the digital value of the color realized when the polishing operation has been completed approximate each other, the digital value which is registered may be reduced (the color sensitivity is lowered) It is preferable that the value obtained from the actual and manual CMP polishing is recorded.

The color identifying sensor incorporates the display lamp which displays the red LED when the state of ON and displays the green LED when the state is OFF. Therefore, the LED lamp of the amplifier 301 is checked to make a comparison between the number of the red display times and the green display times. Therefore, when the number of the green display times is increased, a fact that polishing of the wafer nears the end point can be determined in a case of the CMP process of a coppered wafer.

Figure 9:
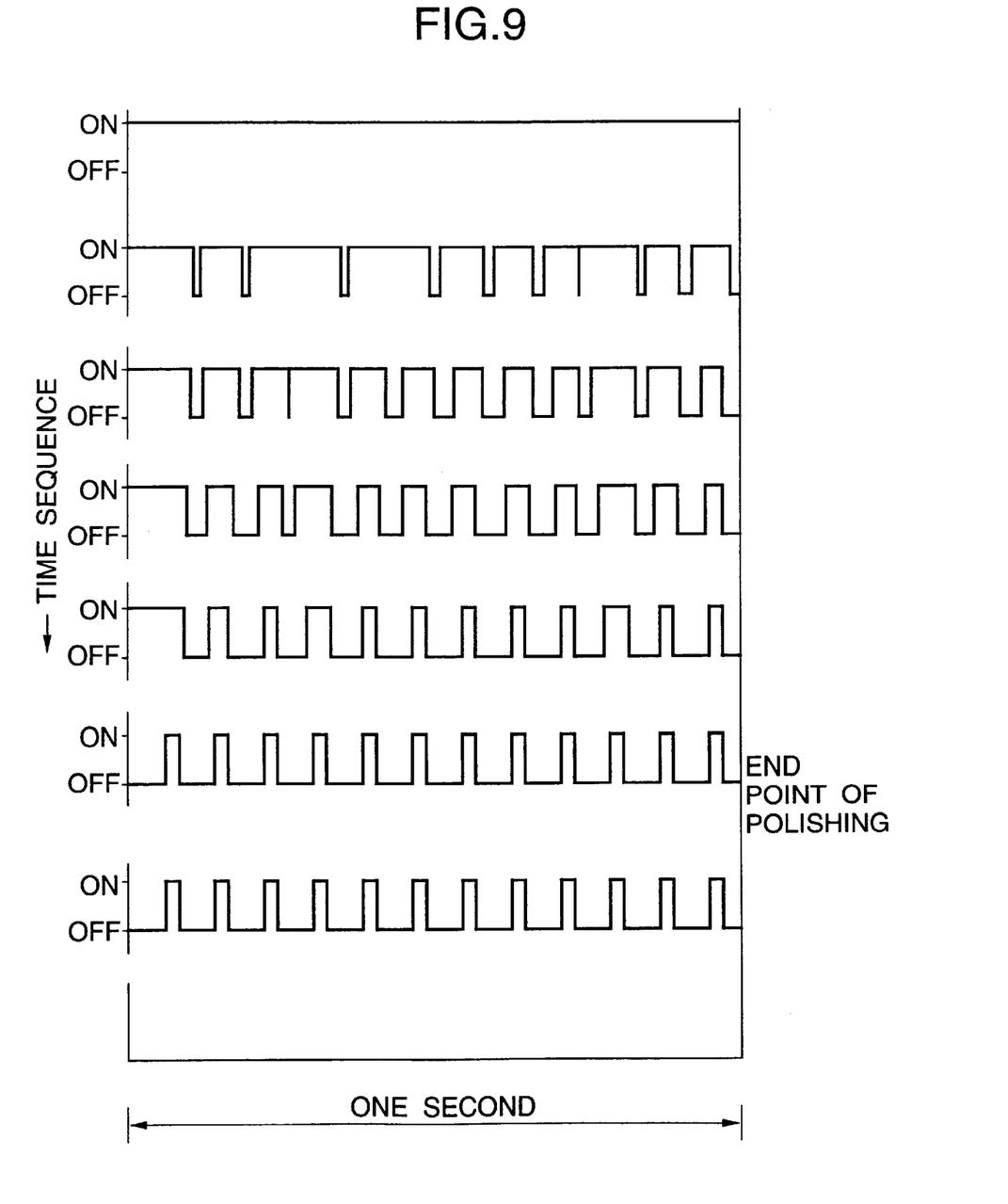
FIG. 9 is a graph showing a pattern of on/off digital display for each second during polishing of a coppered wafer.

FIG. 9 shows a representative time sequence of the digital display of ON/OFF for each unit time in the case of the CMP of the coppered wafer. In the graph, zero on the axis of ordinate indicates OFF and one indicates ON, while the axis of abscissa indicates time (one second). In an initial stage, copper existed on the overall surface of the wafer and, therefore, the state was ON without exception. As the time elapsed, the number of OFF-states increased. When polishing was completed, the ratio off (on+off) of the polished wafer was about 20%.

The conventional method of detecting an end point of polishing is arranged to perform the detection in accordance with the quantity of reflection of laser beams and the conventional method of detecting an end point of polishing uses ultrasonic waves. As compared with the foregoing conventional methods, the method of detecting an end point of CMP polishing according to the present invention is free from an influence of irregular reflection of the laser beam and ultrasonic wave owing to presence of water on the wafer. Even if the surface of the wafer has a stepped portion and the distance between the detector and the wafer varies, the color identifying sensor on which the influence of the distance is not exerted is employed to sense the color of the subject which must be detected. Therefore, the end point of polishing can considerably accurately be detected.

What is claimed is:

1. A method of detecting an end point of polishing of a wafer comprising the steps of:

providing a color identifying sensor to recognize a color component of light;

inputting data on a color component of a substance of the wafer to the color identifying sensor, in which said color identifying sensor displays an ON-state when the color component is detected and an OFF-state when the color component is not detected;

rotating the wafer to start to polish the wafer;

emitting light from a light source to the wafer;

irradiating a point, except for the central point, on the surface of the wafer with the light;

converging the light reflected by the point of the wafer to an optical fiber;

counting the number (m) of times of OFF-states for each of predetermined periods of time by the color identifying sensor; and finishing polishing of the wafer when the number of times (m) coincides with the number (n) of times of off-states indicating an optimum end point of polishing of the wafer in the predetermined period of time.

2. The method as claimed in claim 1, wherein the wafer to be polished is a wafer having a device on a surface of a silicon substrate, and the overall surface of the wafer is coated with copper.

3. The method as claimed in claim 1, wherein the predetermined period of time is to be required for rotating the wafer one time.

4. An apparatus for detecting an end point of polishing of a wafer for chemimechanically polishing the wafer, said apparatus comprising:

(a) a color identifying sensor having a light source and an optical fiber, for recognizing a color component of light emitted from the light source and converged to the optical fiber, the color identifying sensor previously recognizing a color component of a substance of the wafer, the color identifying sensor displaying an ON-state when the color component is recognized and an OFF-state when the color component is not recognized, in which the light source irradiats a point, except for the central point, of a surface of the wafer with the light emitted from the light source;

(b) a counter for detecting the number of times (m) of off-states in a predetermined period of time during an operation for polishing the wafer;

(c) a storage device for storing the number of detection times;

(d) a calculator for making a comparison between the number of times (m) of off-states communicated from said counter as a signal and the number (n) of off-states previously recorded in said storage means and indicating an optimum end point of polishing of the wafer in a predetermined time; and (e) a controller for transmitting, to a chemimechanical polishing apparatus, a signal indicating a fact that a moment of time at which m=n is an end point of polishing of the wafer.

* * * * *